(12) United States Patent
Liu et al.

(10) Patent No.: US 11,031,351 B2
(45) Date of Patent: Jun. 8, 2021

(54) METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Zi-Jheng Liu, Taoyuan (TW); Jo-Lin Lan, Kaohsiung (TW); Yu-Hsiang Hu, Hsinchu (TW); Hung-Jui Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/272,935

(22) Filed: Feb. 11, 2019

(65) Prior Publication Data

US 2019/0172796 A1 Jun. 6, 2019

Related U.S. Application Data

(62) Division of application No. 15/289,173, filed on Oct. 8, 2016, now Pat. No. 10,204,870.

(Continued)

(51) Int. Cl.
*H01L 23/31* (2006.01)
*H01L 23/538* (2006.01)
(Continued)

(52) U.S. Cl.
CPC .......... *H01L 23/562* (2013.01); *H01L 21/486* (2013.01); *H01L 21/4857* (2013.01); *H01L 21/6835* (2013.01); *H01L 21/78* (2013.01); *H01L 23/3128* (2013.01); *H01L 23/5383* (2013.01); *H01L 23/5384* (2013.01); *H01L 23/5389* (2013.01); *H01L 23/544* (2013.01); *H01L 23/585* (2013.01); *H01L 21/4853* (2013.01); *H01L 21/561* (2013.01); *H01L 21/568* (2013.01); *H01L 23/5386* (2013.01); *H01L 23/564* (2013.01); *H01L 2221/68345* (2013.01); *H01L 2221/68359* (2013.01);
(Continued)

(58) Field of Classification Search
CPC ............... H01L 23/562; H01L 21/4853; H01L 21/4857; H01L 21/486; H01L 21/565
See application file for complete search history.

(56) References Cited

U.S. PATENT DOCUMENTS 6,300,223 B1 10/2001 Chang et al.
2006/0076651 A1 4/2006 Tsutsue
(Continued)

FOREIGN PATENT DOCUMENTS

| CN | 101419948 A | 4/2009 |
| CN | 102201394 A | 9/2011 |
| CN | 105261609 A | 1/2016 |

*Primary Examiner* — Dale E Page
*Assistant Examiner* — Wilner Jean Baptiste
(74) *Attorney, Agent, or Firm* — Maschoff Brennan

(57) ABSTRACT

A method includes forming an insulating film over a semiconductor structure, forming a sealing ring over a sidewall of the insulating film, and forming a protective layer over an exposed sidewall of the sealing ring. The semiconductor structure includes a semiconductor chip and a molding compound disposed around the semiconductor chip. The exposed sidewall of the sealing ring faces away from the sidewall of the insulating film.

20 Claims, 8 Drawing Sheets

Related U.S. Application Data

(60) Provisional application No. 62/329,125, filed on Apr. 28, 2016.

(51) Int. Cl.
  *H01L 23/00* (2006.01)
  *H01L 23/58* (2006.01)
  *H01L 23/544* (2006.01)
  *H01L 21/48* (2006.01)
  *H01L 21/78* (2006.01)
  *H01L 21/683* (2006.01)
  *H01L 21/56* (2006.01)

(52) U.S. Cl.
  CPC ............... *H01L 2223/5446* (2013.01); *H01L 2224/04105* (2013.01); *H01L 2224/12105* (2013.01); *H01L 2224/19* (2013.01); *H01L 2224/73267* (2013.01); *H01L 2224/92244* (2013.01)

(56) References Cited

U.S. PATENT DOCUMENTS

| | | |
|---|---|---|
| 2007/0210423 A1 | 9/2007 | Hsu |
| 2009/0108409 A1 | 4/2009 | Tsutsue |
| 2009/0309212 A1* | 12/2009 | Shim, II .............. H01L 21/568 257/700 |
| 2011/0272800 A1 | 11/2011 | Chino |
| 2013/0075936 A1 | 3/2013 | Lin et al. |
| 2013/0249075 A1 | 9/2013 | Tateiwa et al. |
| 2014/0239456 A1* | 8/2014 | Yoshizawa ........... H01L 23/585 257/620 |
| 2015/0311132 A1 | 10/2015 | Kuo et al. |
| 2016/0013124 A1 | 1/2016 | Chen et al. |
| 2016/0071779 A1* | 3/2016 | Chen ............... H01L 21/76895 257/787 |
| 2016/0276311 A1* | 9/2016 | Meyer .................. H01L 23/49 |

\* cited by examiner

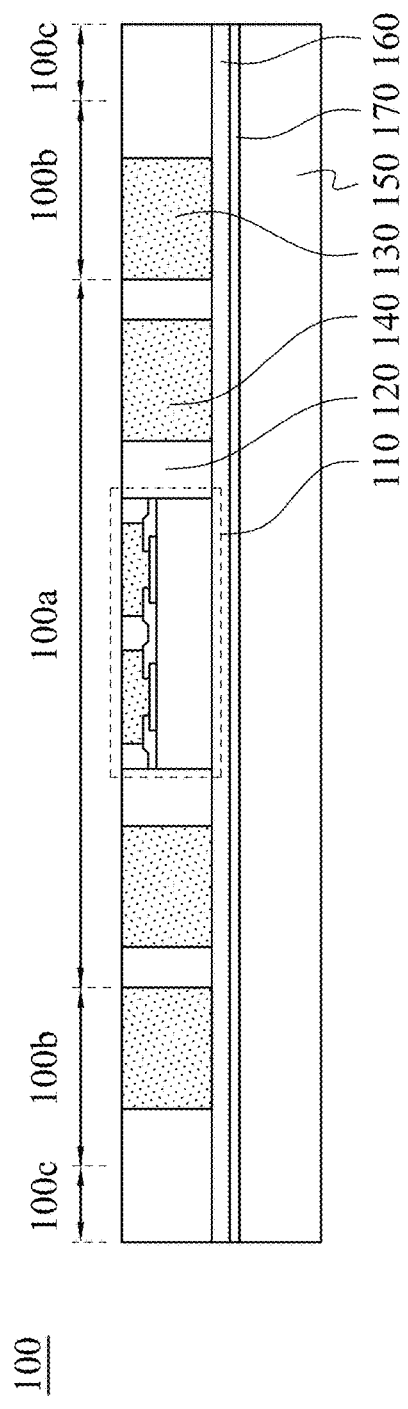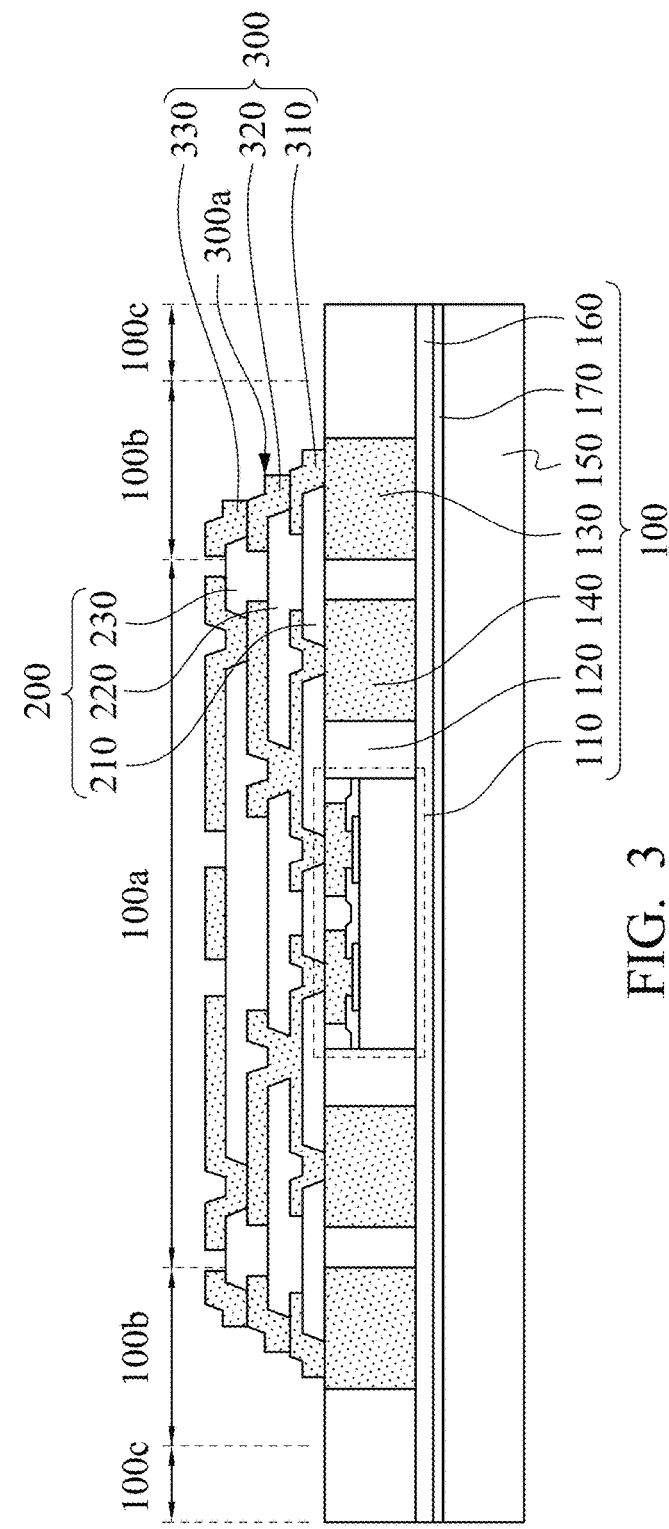

METHOD OF MANUFACTURING A SEMICONDUCTOR DEVICE

PRIORITY CLAIM AND CROSS-REFERENCE

This application is a divisional of U.S. patent application Ser. No. 15/289,173, filed Oct. 8, 2016, now U.S. Pat. No. 10,204,870, issued Feb. 12, 2019, which claims priority to U.S. Provisional Application Ser. No. 62/329,125, filed Apr. 28, 2016, both of which are herein incorporated by reference in their entirety.

BACKGROUND

Semiconductor devices are typically produced by placing a multiplicity of integrated circuits (ICs), each formed by a plurality of elements and having a predetermined function, in a matrix pattern on, e.g., a semiconductor wafer such as silicon.

A multiplicity of chips placed on the wafer substrate are separated from each other by a scribe region (a scribe line) provided in a grid pattern. After forming a plurality of chips on a single substrate through a semiconductor manufacturing process, the substrate is divided into individual semiconductor devices through dicing the substrate along the scribe region into individual chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 5 are cross-sectional views at various stages of manufacturing a semiconductor device in accordance with some embodiments of the present disclosure.

DETAILED DESCRIPTION

Figure 1:
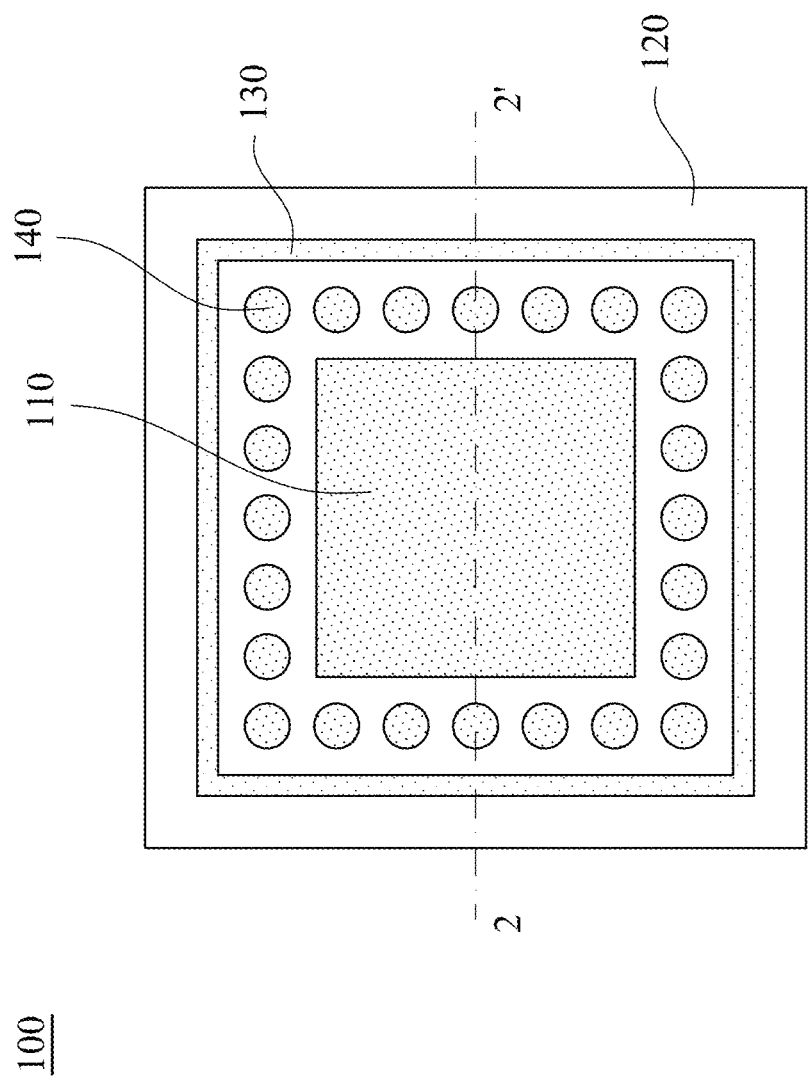
FIG. 1 is a top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, after forming a plurality of chips on a single substrate through a semiconductor manufacturing process, the substrate is divided into individual semiconductor devices through dicing the substrate along a scribe region into individual chips. If there are a molding compound and insulating layers (e.g., polyimide layers) at the scribe region, a laser pre-cut process may be performed to cut the insulating layers and thus to expose a portion of the molding compound, and a die saw process may then be performed to cut the molding compound. However, the laser pre-cut process is costly.

The present disclosure provides a method of manufacturing a semiconductor device without forming insulating layer at the scribe line region to remove the need for the laser pre-cutting process, thereby reducing production cost. In addition, the method of manufacturing the semiconductor device can avoid a variety of delamination (peeling) during processes, especially wet processes using chemicals, such as photoresist stripping processes or etching processes. Embodiments of the method of manufacturing the semiconductor device will be described below in detail.

FIG. 1 is a top view of a semiconductor structure 100 in accordance with some embodiments of the present disclosure. FIGS. 2 to 5 are cross-sectional views at various stages of manufacturing a semiconductor device 50 in accordance with some embodiments of the present disclosure.

FIG. 2 is a cross-sectional view of the semiconductor structure 100 taken along a section line 2-2' of FIG. 1 in accordance with some embodiments of the present disclosure. As shown in FIGS. 1 and 2, a semiconductor structure 100 is illustrated. Referring to the top view of FIG. 1, in practical applications, there may be a plurality of chip regions defined over a wafer (only one is shown here), and the chip regions are separated from each other by a plurality of ring-shaped seal ring regions (not shown). In addition, a plurality of scribe lines/regions (not shown) is provided in a grid pattern to virtually separate adjacent chips on the wafer from one another. The semiconductor structure 100 has a chip region 100a, a seal ring region 100b surrounding the chip region 100a, and a scribe region 100c surroundingly defined around the seal ring region 100b.

The semiconductor structure 100 includes a semiconductor chip (die) 110 and a molding compound 120 disposed around the semiconductor chip 110, as shown in FIG. 1. As shown in FIG. 2, the semiconductor chip 110 is in the chip region 100a. The molding compound 120 is distributed in the chip region 100a, the seal ring region 100b, and the scribe region 100c. In some embodiments, the semiconductor chip 110 has an upper surface coplanar with an upper surface of the molding compound 120.

In some embodiments, as shown in FIG. 2, the semiconductor structure 100 further includes a conductive pattern 130 in the seal ring region 100b. In some embodiments, the conductive pattern 130 is separated from the semiconductor chip 110. In some embodiments, the conductive pattern 130 has an upper surface coplanar with an upper surface of the molding compound 120. In some embodiments, the conductive pattern 130 includes copper. In some embodiments, as shown in FIG. 1, the conductive pattern 130 comprises a rectangular ring-like profile that continuously surrounds the semiconductor chip 110. In some embodiments, as shown in FIG. 1, a side of the conductive pattern 130 is substantially parallel to a side of the semiconductor chip 110.

In some embodiments, as shown in FIG. 2, the semiconductor structure 100 further includes a through via 140 in the chip region 100a. In some embodiments, the through via 140 is configured to connect other components (not shown). In some embodiments, the through via 140 is a through InFO (integrated fan-out) via (TIV). In some embodiments, the through via 140 is arranged laterally between the semiconductor chip 110 and the conductive pattern 130. In some embodiments, the through via 140 includes copper. In some embodiments, as shown in FIG. 1, a plurality of circular-shaped through vias 140 are arranged around the semiconductor chip 110, and are further surrounded by the ring-shaped conductive pattern 130.

As shown in FIG. 2, the semiconductor structure 100 further includes a carrier substrate 150 beneath the semiconductor chip 110 and the molding compound 120. In some embodiments, the carrier substrate 150 is also beneath the conductive pattern 130 and the through via 140. In some embodiments, the carrier substrate 150 is configured to support the semiconductor chip 110 and the molding compound 120 during a series of processes, such as photolithographic and etching processes, electroplating processes and/or mounting processes. In some embodiments, the carrier substrate 150 is made of glass, quartz or any other suitable material.

As shown in FIG. 2, the semiconductor structure 100 further includes an insulating layer 160 arranged between the semiconductor chip 110/molding compound 120 and the carrier substrate 150. In some embodiments, the insulating layer 160 includes polyimide resin.

In some embodiments, the semiconductor structure 100 further includes a release layer 170 between the insulating layer 160 and the carrier substrate 150. In some embodiments, the release layer 170 is configured to separate the carrier substrate 150 from the insulating layer 160. In some embodiments, the release layer 170 is a light to heat conversion layer (LTHC).

As shown in FIG. 3, an insulating film 200 is formed over the chip region 100a of the semiconductor structure 100 and the seal ring region 100b of the semiconductor structure 100. In addition, a seal ring 300 is formed over the seal ring region 100b of the semiconductor structure 100. The seal ring 300 is formed laterally adjacent to the insulating film 200 and has an exposed lateral surface 300a facing away from the insulating film 200. In some embodiments, the seal ring 300 is formed over and in contact with the conductive pattern 130.

In some embodiments, forming the insulating film 200 includes forming a plurality of insulating layers stacked to each other and in a stair-like configuration, such as a first insulating layer 210, a second insulating layer 220, and a third insulating layer 230, as shown in FIG. 3. In some embodiments, the seal ring 300 includes a plurality of conductive layers/features connected to each other, such as a first conductive layer/feature 310, a second conductive layer/feature 320 and a third conductive layer/feature 330, as shown in FIG. 3. In some embodiments, forming the seal ring 300 includes forming a stair-like portion (e.g., the first, second and third conductive features 310, 320 and 330) of the seal ring 300 laterally adjacent to the insulating layers (e.g., the first, second and third insulating layers 210, 220 and 230) in the stair-like configuration. Embodiments of forming the insulating film 200 and the seal ring 300 will be described in detail below.

In some embodiments, the first insulating layer 210 is formed over the chip region 100a of the semiconductor structure 100 and the seal ring region 100b of the semiconductor structure 100. In some embodiments, a first insulating material (not shown) is blanket formed (e.g. by spin coating) over the chip region 100a and the seal ring region 100b and then patterned, e.g. using a photolithographic (including exposure and development) process, to form the first insulating layer 210. In some embodiments, the first insulating layer 210 includes polyimide resin.

In some embodiments, forming the first insulating layer 210 further includes forming the first insulating layer 210 over and in contact with the conductive pattern 130. In some embodiments, the conductive pattern 130 has great light reflection compared to the molding compound 120, resulting in large process window of the exposure process. Therefore, the conductive pattern 130 can help to form small via openings (e.g., diameter less than or equal to 10 microns) of the first insulating layer 210.

In some embodiments, the first conductive layer 310 is formed over the chip region 100a of the semiconductor structure 100 and the seal ring region 100b of the semiconductor structure 100 and laterally adjacent to a peripheral portion (not marked) of the first insulating layer 210. In some embodiments, the first conductive layer 310 formed over the seal ring region 100b is aced as a portion of the seal ring 300, and the first conductive layer 310 formed over the chip region 100a is acted as a portion of an interconnect structure (not marked). In some embodiments, a first conductive material is blanket formed (e.g., by electroplating) over the first insulating layer 210 and then patterned (e.g. using photolithographic and etching processes) to form the first conductive layer 310. In some embodiments, the first conductive layer 310 includes copper.

In some embodiments, the second insulating layer 220 is formed over the first insulating layer 210 yet exposing a lateral surface of the first conductive feature 310 facing away from the first insulating layer 210. In some embodiments, a second insulating material (not shown) is blanket formed (e.g. by spin coating) over the first insulating layer 210 and the first conductive layer 310 and then patterned (e.g. using a photolithographic (including exposure and development) process) to form the second insulating layer 220. In some embodiments, the second insulating layer 220 includes polyimide resin.

In some embodiments, the second conductive layer 320 is formed over and laterally adjacent to a peripheral portion of the second insulating layer 220 yet exposing a lateral surface of the second conductive feature 320 facing away the second insulating layer 220. In some embodiments, the second conductive layer 320 is formed over and in contact with the peripheral portion of the second insulating layer 220 and the first conductive feature 310. In some embodiments, the second conductive layer 320 formed over the seal ring region 100b is aced as a portion of the seal ring 300, and the second conductive layer 320 formed over the chip region 100a is acted as a portion of the interconnect structure (not marked). In some embodiments, a second conductive material is blanket formed (e.g., by electroplating) over the second insulating layer 220 and the first conductive feature 310 and then patterned (e.g. using photolithographic and etching processes) to form the second conductive layer 320. In some embodiments, the second conductive layer 320 includes copper.

In some embodiments, the third insulating layer 230 is formed over the second insulating layer 220 yet exposing the lateral surface of the second conductive feature 320 facing away the second insulating layer 220. In some embodiments, a third insulating material (not shown) is blanket formed (e.g. by spin coating) over the second insulating layer 220 and the second conductive layer 320 and then patterned (e.g. using a photolithographic (including exposure and development) process) to form the third insulating layer 230. In some embodiments, the third insulating layer 230 includes polyimide resin.

In some embodiments, the third conductive layer 330 is formed over and laterally adjacent to a peripheral portion of the third insulating layer 230. In some embodiments, the third conductive layer 330 is formed over and in contact with the peripheral portion of the third insulating layer 230 and the second conductive layer 320. In some embodiments, the third conductive layer 330 formed over the seal ring region 100b is aced as a portion of the seal ring 300, and the third conductive layer 330 formed over the chip region 100a is acted as a portion of the interconnect structure (not marked). In some embodiments, a third conductive material is blanket formed (e.g., by electroplating) over the third insulating layer 230 and the second conductive layer 320 and then patterned (e.g. using photolithographic and etching processes) to form the third conductive layer 330. In some embodiments, the third conductive layer 330 includes copper.

Figure 4:
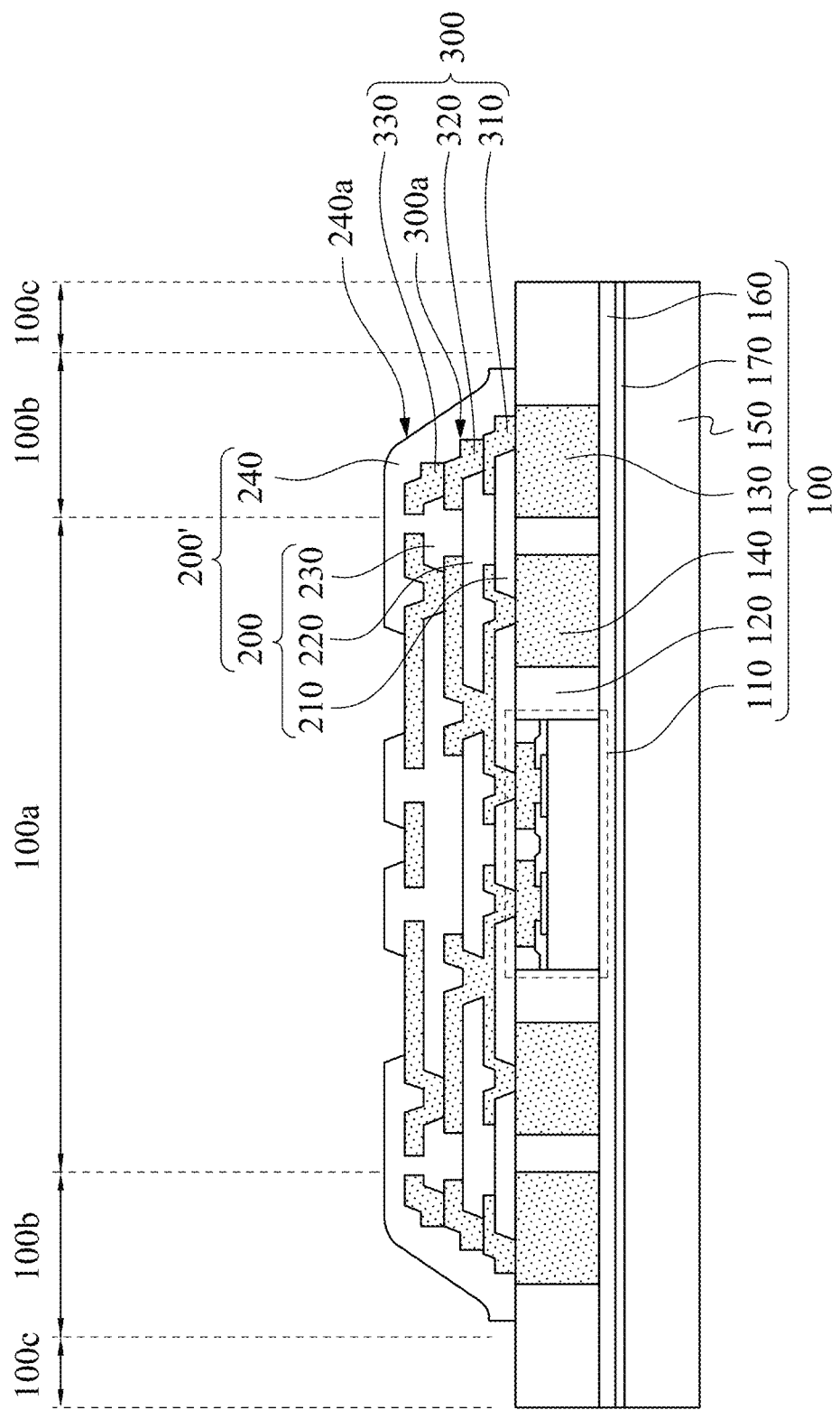
Figure 10:
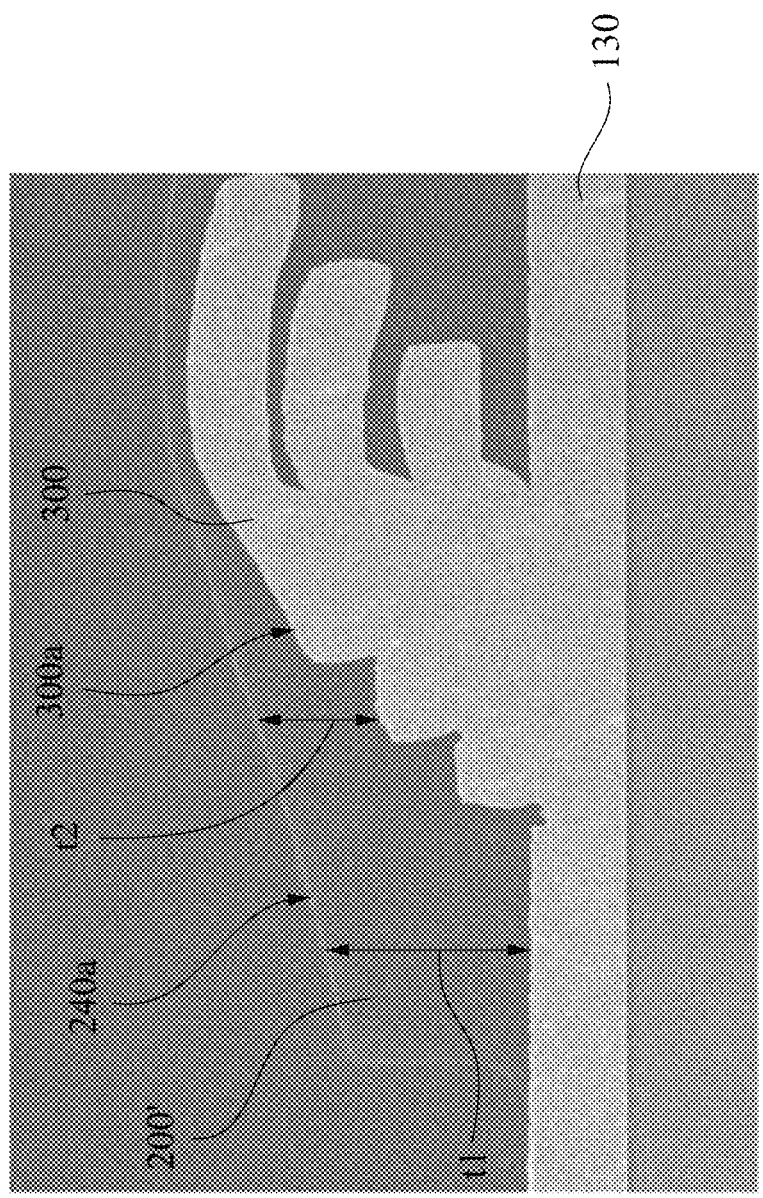
FIG. 10 is a SEM image of a seal ring and an insulating structure in accordance with some embodiments of the present disclosure.

As shown in FIG. 4, after the insulating film 200 and the seal ring 300 are formed, a protective layer 240 is formed that defines an substantially smooth and inclined lateral surface 240a over the exposed lateral surface 300a of the seal ring 300. In some embodiments, the substantially smooth and inclined lateral surface 240a is formed over the exposed lateral surfaces of the first and second conductive features 310 and 320. In some embodiments, forming the protective layer 240 includes forming the protective layer 240 that defines the substantially smooth and inclined lateral surface 240a over the stair-like portion of the seal ring 300. The term "substantially smooth and inclined lateral surface" herein refers to the inclined lateral surface having a profile without abrupt ups and downs in an enlarged cross-sectional view, e.g., as shown in FIG. 10. In some embodiments, the protective layer 240 is formed in contact with the first conductive feature 310 and the second conductive layer 320. In some embodiments, the protective layer 240 is formed further in contact with the third conductive layer 330. In some embodiments, the protective layer 240 is made of a same material as the insulating film 200. In some embodiments, the protective layer 240 is made of a same material as the first insulating layer 210, the second insulating layer 220 or the third insulating layer 230. In some embodiments, the protective layer 240 includes polyimide resin. In some embodiments, a protective material (not shown) is blanket formed (e.g., by spin coating) over the insulating film 200 and the seal ring 300, and then patterned (e.g., using a photolithographic (including exposure and development) process) to form the protective layer 240.

In some embodiments, because of the protective layer 240, the stair-like portion of the seal ring 300 and the insulating film 200 in the stair-like configuration, no delamination occurs between the insulating film 200 and the semiconductor structure 100 (e.g., between the first insulating layer 210 and the conductive pattern 130) or between the protective layer 240 and the conductive pattern 130. Also, no delamination occurs between the first and second insulating layers 210, 220, or between the second and third insulating layers 220, 230, or between the third insulating layer 230 and the protective layer 240. In some embodiments, the seal ring 300 and the conductive pattern 130 constitutes a full wall to provide excellent moisture protection.

Figure 5:
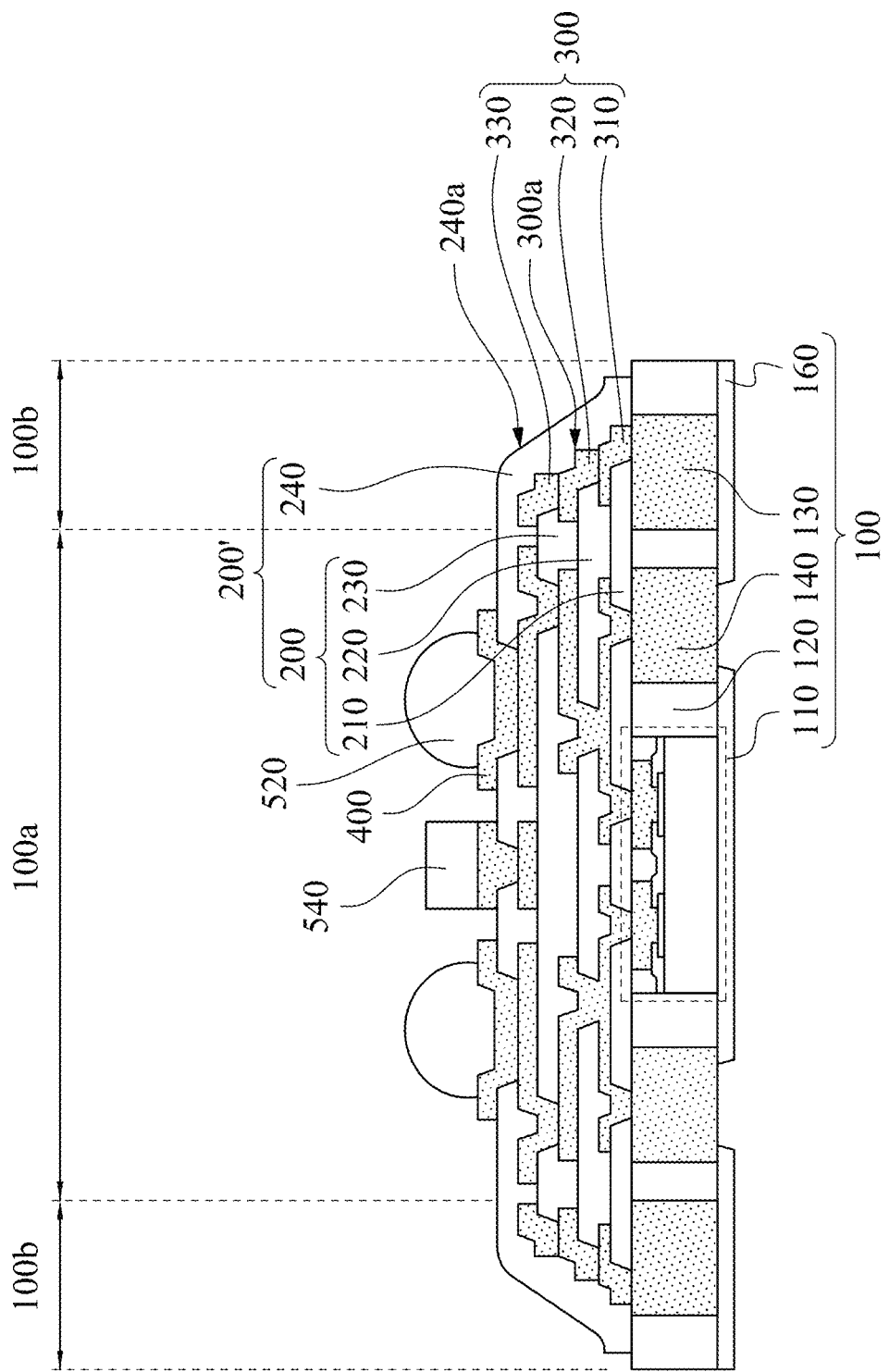
Figure 6:
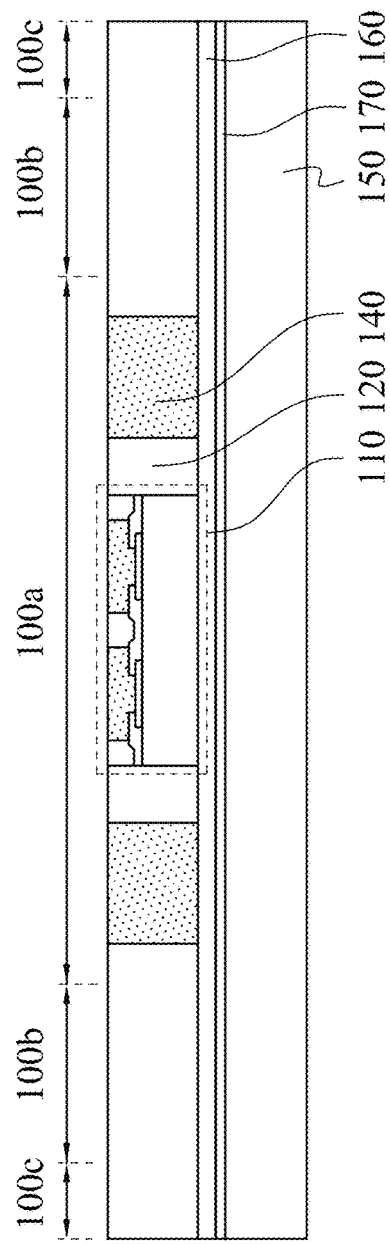
FIGS. 6 to 9 are cross-sectional views at various stages of manufacturing a semiconductor device in accordance with some embodiments of the present disclosure.
Figure 7:
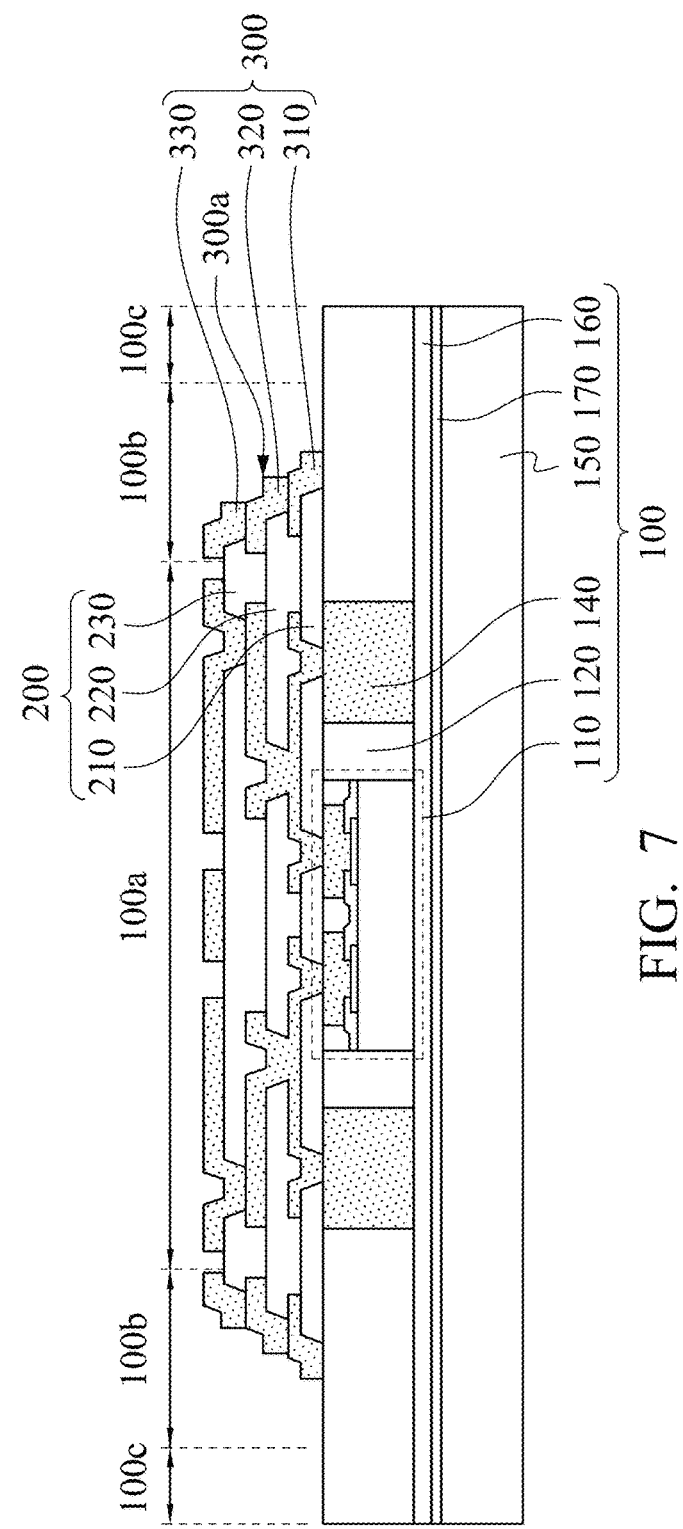
Figure 8:
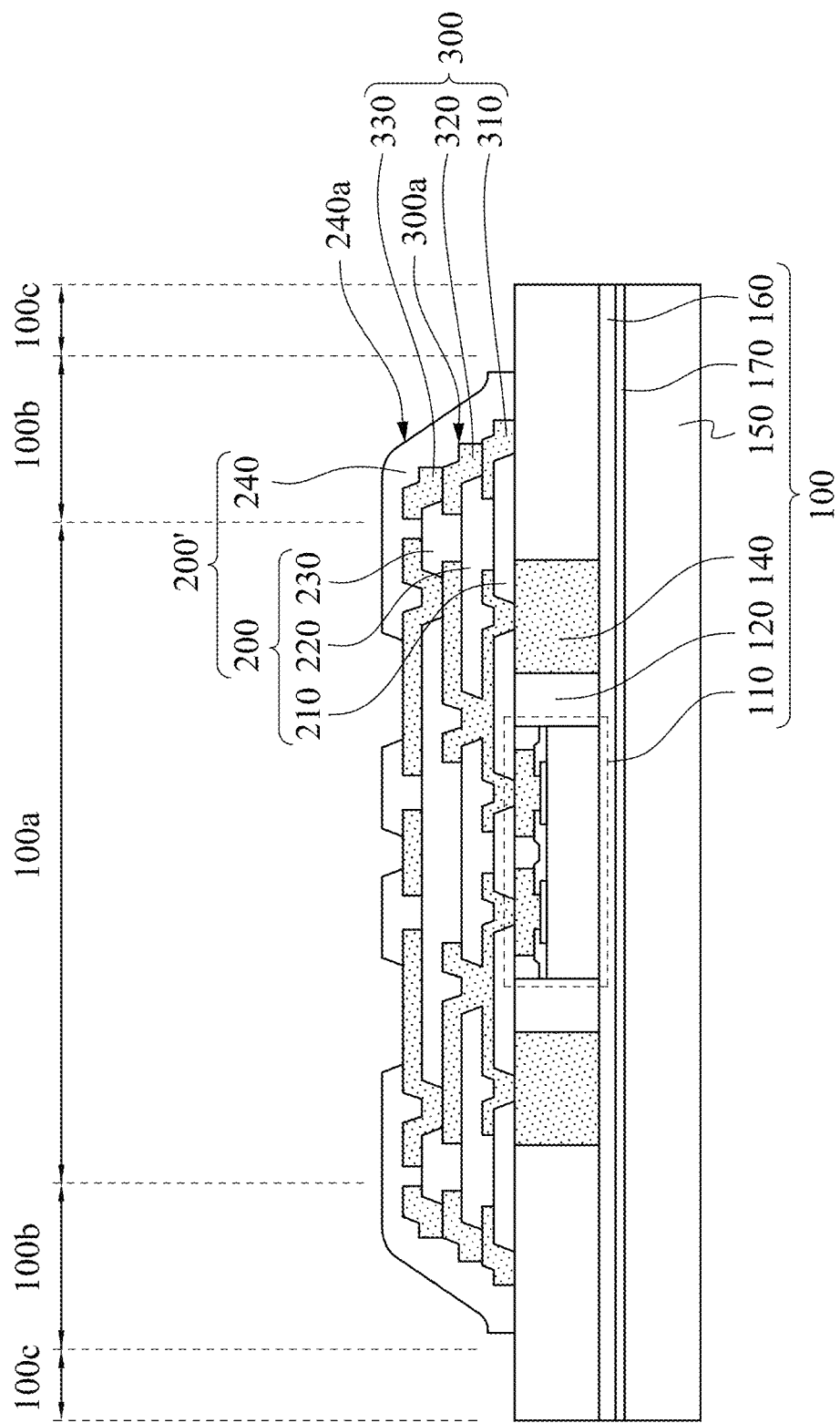

As shown in FIG. 5, after the protective layer 240 is formed, a plurality of under-bump-metallurgies (UBMs) 400 are formed over and in contact with the third conductive layer 330. In some embodiments, after the UBMs 400 are formed, balls 520 and a device 540 are formed respectively in contact with the UBMs 400. In some embodiments, the balls 520 constitutes a ball grid array (BGA), and the ball 520 may also be called as a BGA pad. In some embodiments, the device 540 is an integrated passive device (IPD).

In some embodiments, after the balls 520 and the device 540 are formed, the carrier substrate 150 is removed. In some embodiments, the carrier substrate 150 is removed using a de-bonding process (e.g., laser process). Specifically, as shown in FIGS. 4 and 5, the de-bonding process is performed to remove the release layer 170, and thus to separate the insulating layer 160 and the structure thereover from the carrier substrate 150.

In some embodiments, after the de-bonding process is performed, a laser drill process is performed to form through holes (not marked) through the insulating layer 160 to expose the through vias 140, as shown in FIG. 5. In some embodiments, as shown in FIGS. 4 to 5, after the laser drill process is performed, a dicing process is performed to dice the molding compound 120 along the scribe region 100c of the semiconductor substrate 100. There is no need for a laser pre-cut process due to no insulating layer over the scribe region 100c of the semiconductor structure 100 of FIG. 4.

FIGS. 6 to 9 are cross-sectional views at various stages of manufacturing a semiconductor device 90 in accordance with some embodiments of the present disclosure. The difference between the embodiments of FIGS. 6 to 9 and those of FIGS. 2 to 5 is that the semiconductor structure 100 of FIGS. 2 to 5 further includes the conductive pattern 130. Embodiments of FIGS. 6 to 9 may be same as or similar to those of FIGS. 2 to 5, and thus are omitted herein.

Figure 9:
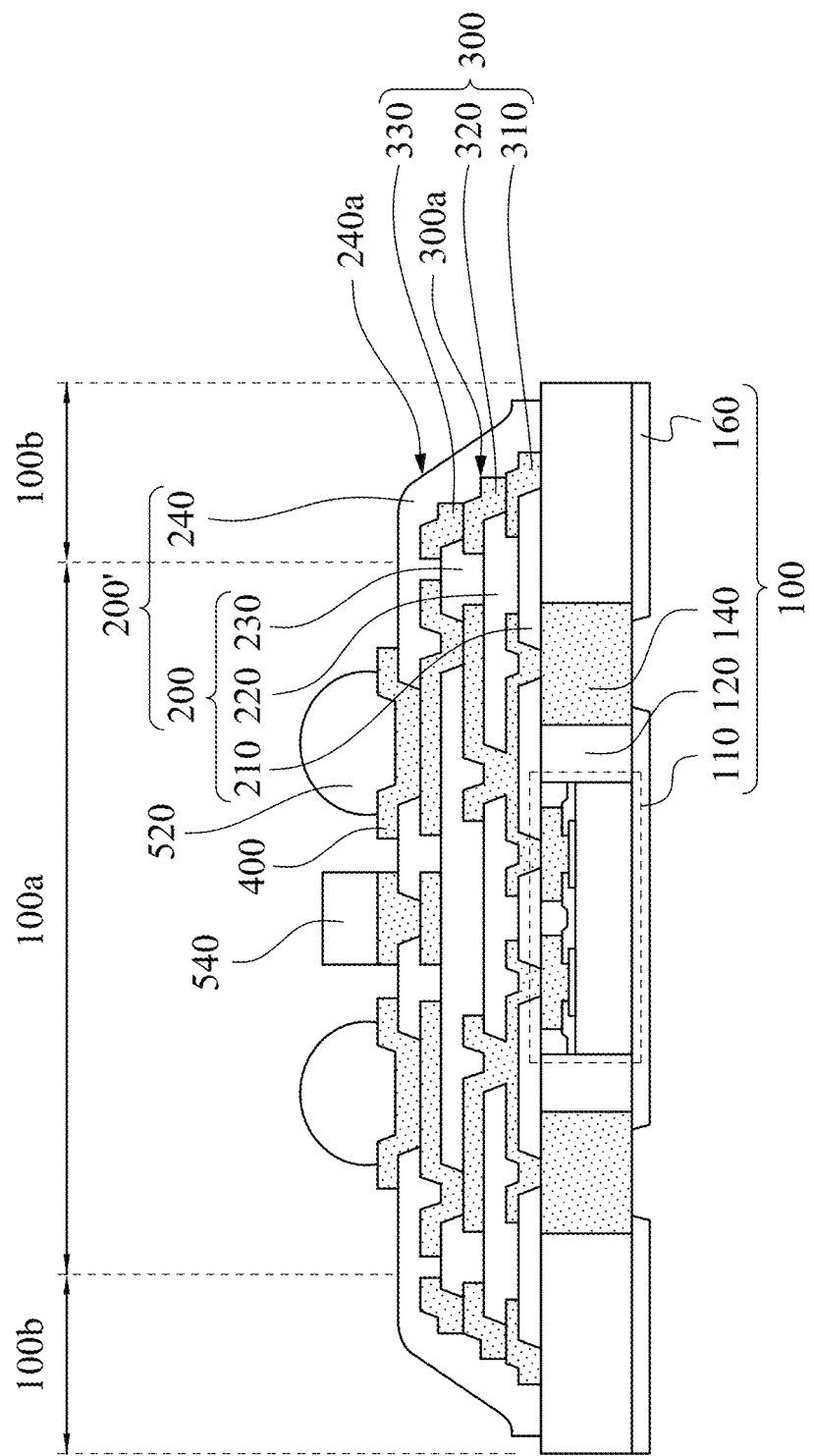

Similar to the embodiments of FIGS. 2 to 5, in some embodiments, as shown in FIG. 9, because of the protective layer 240, the stair-like portion of the seal ring 300 and the insulating film 200 in the stair-like configuration, no delamination occurs between the insulating film 200 and the semiconductor structure 100 (e.g., between the first insulating layer 210 and the molding compound 120) or between the protective layer 240 and the molding compound 120. Also, no delamination occurs between the first and second insulating layers 210, 220, or between the second and third insulating layers 220, 230, or between the third insulating layer 230 and the protective layer 240.

The present disclosure further provides a semiconductor device. As shown in FIG. 5 or 9, the semiconductor device 50 or 90 includes a semiconductor structure 100, an insulating structure 200' and a seal ring 300.

The semiconductor structure 100 has a chip region 100a and a seal ring region 100b surrounding the chip region 100a. The semiconductor structure 100 includes a semiconductor chip 110 and a molding compound 120 surrounding the semiconductor chip 110, as shown in FIG. 1. As shown in FIG. 5 or 9, the semiconductor chip 110 is in the chip region 100a. The molding compound 120 is in the chip region 100a and the seal ring region 100b. In some embodiments, the semiconductor chip 110 has an upper surface coplanar with an upper surface of the molding compound 120.

The insulating structure 200' is disposed over the chip region 100a of the semiconductor structure 100 and the seal ring region 100b of the semiconductor structure 100. The insulating structure 200' has a substantially smooth and inclined exposed lateral surface 240a and covers the seal ring 300. The term "substantially smooth and inclined lateral exposed surface" herein refers to the inclined lateral exposed surface having a profile without noticeable ups and downs in an cross-sectional view, such as shown in FIG. 10. In some embodiments, the substantially smooth and inclined exposed lateral surface 240a of the insulating structure 200' obliquely extends upwardly from the seal ring region 100b of the semiconductor structure 100 toward the chip region 100a of the semiconductor structure 100. In some embodiments, the insulating structure 200' is constituted by a plurality of insulating layers, such as a first insulating layer 210, a second insulating layer 220, a third insulating layer 230 and a protective layer 240. In some embodiments, the first insulating layer 210, the second insulating layer 220, the third insulating layer 230 and the protective layer 240 include polyimide resin. In some embodiments, the first insulating layer 210, the second insulating layer 220, the third insulating layer 230 and the protective layer 240 are made of a same material.

The seal ring 300 is positioned over the seal ring region 100b of the semiconductor structure 100 and covered by the insulating structure 200'. In some embodiments, as shown in FIG. 5 or 9, the seal ring 300 includes a plurality of Z-shaped or L-shaped portions 310, 320 and 330 connected to each other. In some embodiments, the seal ring 300 is stair-shaped. In some embodiments, the seal ring 300 is obliquely extended upwardly from the seal ring region 100b of the semiconductor structure 100 toward the chip region 100a of the semiconductor structure 100.

In some embodiments, as shown in FIG. 5 or 9, the seal ring 300 has a stair-shaped outer lateral surface 300a. The "outer lateral surface 300a" of the seal ring 300 refers to the lateral surface of the seal ring 300 facing away from the chip region 100a. FIG. 10 provides an SEM image of a seal ring 300 and an insulating structure 200' in accordance with some exemplary embodiments of the present disclosure. As shown in FIG. 10, the seal ring 300 has the stair-shaped outer lateral surface 300a, and the insulating structure 200' has a substantially smooth and inclined exposed lateral surface 240a.

In some embodiments, as shown in FIG. 9, the seal ring 300 is in contact with the molding compound 120. In some embodiments, as shown in FIG. 5, the semiconductor structure 100 further includes a conductive pattern 130 in the seal ring region 100b of the semiconductor structure 100 and in contact with the seal ring 300. In some embodiments, the conductive pattern 130 has an upper surface coplanar with an upper surface of the molding compound 120. In some embodiments, the conductive pattern 130 includes copper. In some embodiments, as shown in FIG. 1, the conductive pattern 130 is ring-shaped and surrounding the semiconductor chip 110. In some embodiments, as shown in FIG. 1, a side of the conductive pattern 130 is substantially or entirely parallel to a side of the semiconductor chip 110.

In some embodiments, the insulating structure 200' is in contact with the conductive pattern 130, as shown in FIG. 5 or 10. In some embodiments, as shown in FIG. 10, the insulating structure 200' over and in contact with the conductive pattern 130 has a thickness t1 greater than a thickness t2 of the insulating structure 200' over and in contact with the seal ring 300.

In some embodiments, as shown in FIG. 5 or 9, the semiconductor structure 100 further includes a through via 140 in the chip region 100a. In some embodiments, the through via 140 is configured to connect other components (not shown). In some embodiments, the through via 140 is a through InFO (integrated fan-out) via (TIV). In some embodiments, the through via 140 includes copper. In some embodiments, as shown in FIG. 1, a plurality of circular-shaped through vias 140 are arranged surrounding the semiconductor chip 110 and surrounded by the ring-shaped conductive pattern 130.

In some embodiments, as shown in FIG. 5 or 9, the semiconductor structure 100 further includes an insulating layer 160 beneath the semiconductor chip 110 and the molding compound 120. In some embodiments, the insulating layer 160 includes polyimide resin. In some embodiments, the insulating layer 160 includes through holes (not marked) to expose portions of the through via 140.

In some embodiments, as shown in FIG. 5 or 9, the semiconductor device 50 or 90 further includes a plurality of under-bump-metallurgies (UBMs) 400 over the insulating structure 200'. In some embodiments, the semiconductor device 50 or 90 further includes balls 520 and a device 540 respectively in contact with the UBMs 400.

In some embodiments, as shown in FIG. 5 or 9, the semiconductor device 50 or 90 further includes an interconnect structure (not marked) over the chip region 100a of the semiconductor structure 100 and covered by the insulating structure 200'. In some embodiments, the balls 520 are electrically connected to the semiconductor chip 110 and the through vias 140 through the interconnect structure.

According to some embodiments, a method includes forming an insulating film over a semiconductor structure. The semiconductor structure includes a semiconductor chip and a molding compound disposed around the semiconductor chip. The method further includes forming a sealing ring over a sidewall of the insulating film. A sidewall of the sealing ring facing away from the sidewall of the insulating film is exposed. The method further includes forming a protective layer over the exposed sidewall of the sealing ring.

According to some embodiments, a method includes forming an insulating film over a semiconductor structure. The semiconductor structure includes a semiconductor chip and a molding compound disposed around the semiconductor chip. The method further includes forming a sealing ring over a sidewall of the insulating film and forming a protective layer over a sidewall of the sealing ring and in contact with a top surface of the semiconductor structure.

According to some embodiments, a method includes forming an insulating film over a semiconductor structure. The semiconductor structure includes a semiconductor chip and a molding compound disposed around the semiconductor chip. The method further includes forming a sealing ring. The sealing ring has a first portion extending substantially along a top surface of the semiconductor structure, a second portion extending substantially along a sidewall of the insulating film, and a third portion extending substantially along a top surface of the insulating film. The method further includes forming a protective layer over the sealing ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an insulating film over a semiconductor structure, wherein the semiconductor structure comprises:
      a semiconductor chip; and
      a molding compound disposed around the semiconductor chip;
   forming a sealing ring over a sidewall of the insulating film, wherein a sidewall of the sealing ring facing away from the sidewall of the insulating film and a top surface of the molding compound are exposed, wherein forming the seal ring is performed such that the exposed sidewall of the seal ring has a stair-shaped surface; and
   forming a protective layer in contact with the exposed sidewall of the sealing ring, wherein forming the protective layer is performed such that the protective layer has an inclined and substantially smooth surface that covers the stair-shaped surface of the seal ring.

2. The method of claim 1, wherein forming the protective layer is performed such that the inclined and substantially smooth surface of the protective layer is not in a scribe region.

3. The method of claim 1, wherein forming the seal ring is performed such that the semiconductor chip is surrounded by the seal ring.

4. The method of claim 1, wherein the semiconductor structure comprises a through via in the molding compound.

5. The method of claim 4, wherein forming the seal ring is performed such that the through via is surrounded by the seal ring.

6. The method of claim 1, wherein forming the sealing ring over the sidewall of the insulating film is such that the sealing ring is in contact with the semiconductor structure.

7. The method of claim 1, further comprising forming an under-bump-metallurgies over the insulating film.

8. A method, comprising:
   forming an insulating film over a semiconductor structure, wherein the semiconductor structure comprises:
      a semiconductor chip; and
      a molding compound disposed around the semiconductor chip;
   forming a sealing ring over a sidewall of the insulating film; and
   forming a protective layer over a sidewall of the sealing ring such that a bottom surface of the protective layer is lower than a top surface of the insulating film.

9. The method of claim 8, wherein the semiconductor structure comprises a through via that extends from a top surface to a bottom surface of the molding compound and that is coupled to the semiconductor chip.

10. The method of claim 9, further comprising forming an under-bump-metallurgy (UBM) coupled between the through via and the semiconductor chip.

11. The method of claim 8, wherein the semiconductor structure comprises a conductive pattern that extends from a top surface to a bottom surface of the molding compound and that is coupled to the seal ring, wherein forming the sealing ring is performed such that the sealing ring is coupled to the conductive pattern.

12. The method of claim 11, wherein the semiconductor structure comprises a through via that extends from the top surface to the bottom surface of the molding compound and that is between the semiconductor chip and the conductive pattern.

13. A method, comprising:
   forming an insulating film over a semiconductor structure, wherein the semiconductor structure comprises:
      a semiconductor chip; and
      a molding compound disposed around the semiconductor chip;
   forming a sealing ring, wherein the sealing ring has a first portion extending substantially along a top surface of the semiconductor structure, a second portion extending substantially along a sidewall of the insulating film, and a third portion extending substantially along a top surface of the insulating film; and
   forming a protective layer over the sealing ring and in contact with the molding compound.

14. The method of claim 13, further comprising forming a pair of through vias such that the through vias are in the molding compound and such that the semiconductor chip is between and coupled to the through vias.

15. The method of claim 14, further comprising forming an under-bump-metallurgy (UBM) coupled between one of the through vias and the semiconductor chip.

16. The method of claim 13, further comprising forming a conductive pattern such that the conductive pattern is in the molding compound and such that the semiconductor chip is surrounded by the conductive pattern.

17. The method of claim 16, wherein forming the sealing ring is performed such that the first portion of the sealing ring is coupled to the conductive pattern.

18. The method of claim 13, wherein forming the protective layer is performed such that the protective layer has an inclined and substantially smooth surface that covers the seal ring.

19. The method of claim 18, wherein forming the protective layer is performed such that the protective layer further has a top portion above the seal ring and a bottom portion interconnected by the inclined and substantially smooth surface of the protective layer.

20. The method of claim 19, wherein forming the protective layer is performed such that the top portion of the protective layer and a sidewall portion of the protective layer having the inclined and smooth surface of the protective layer have no interface therebetween.

* * * * *